(12) United States Patent
Wang

(10) Patent No.: US 11,056,666 B2
(45) Date of Patent: Jul. 6, 2021

(54) DISPLAY PANEL, FABRICATING METHOD THEREOF, AND DISPLAY DEVICE

(71) Applicant: Wuhan China Star Optoelectronics Semiconductor Display Technology Co., Ltd., Wuhan (CN)

(72) Inventor: Bo Wang, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 43 days.

(21) Appl. No.: 16/603,856

(22) PCT Filed: Jul. 1, 2019

(86) PCT No.: PCT/CN2019/094128
§ 371 (c)(1),
(2) Date: Oct. 9, 2019

(87) PCT Pub. No.: WO2020/220460
PCT Pub. Date: Nov. 5, 2020

(65) Prior Publication Data
US 2020/0343472 A1 Oct. 29, 2020

(30) Foreign Application Priority Data
Apr. 29, 2019 (CN) .......................... 201910355339.6

(51) Int. Cl.
*H01L 51/52* (2006.01)
*H01L 51/56* (2006.01)
*H01L 51/50* (2006.01)

(52) U.S. Cl.
CPC ...... *H01L 51/5218* (2013.01); *H01L 51/5056* (2013.01); *H01L 51/5215* (2013.01); *H01L 51/5234* (2013.01); *H01L 51/56* (2013.01)

(58) Field of Classification Search
CPC . H01L 51/5218; H01L 51/56; H01L 51/5215; H01L 51/5056; H01L 51/5234
See application file for complete search history.

(56) References Cited

U.S. PATENT DOCUMENTS

2006/0102907 A1* 5/2006 Lee .................. H01L 27/124
257/72

FOREIGN PATENT DOCUMENTS

| CN | 101510578 | 8/2009 |
| CN | 207781652 | 8/2018 |

OTHER PUBLICATIONS

Lee et al. "Highly Transparent and Flexible TiN Doped In2O3 (ITON)/Ag—Ti/ITON Multilayer Electrodes Coated on Polyethylene Terephthalate Substrate", Thin Solid Films, 666: 1-5, Available Online Sep. 13, 2018.

(Continued)

*Primary Examiner* — Kyoung Lee
*Assistant Examiner* — Christina A Sylvia

(57) ABSTRACT

This application relates to a display panel, a fabricating method thereof, and a display device, the display panel includes a substrate; a first transparent conductive layer disposed on the substrate, material of the first transparent conductive layer is nitrogen oxide; a first reflective layer disposed on the first transparent conductive layer; and a second transparent conductive layer disposed on the first reflective layer, material of the second transparent conductive layer is nitrogen oxide.

13 Claims, 3 Drawing Sheets

(56) References Cited

OTHER PUBLICATIONS

Lee et al. "TiN and In2O3 Co-Sputtered Amorphous InTiON Electrodes for Perovskite Solar Cells", Applied Science and Convergence Technology, 27(6): 156-160, Nov. 2018.

* cited by examiner

US 11,056,666 B2

DISPLAY PANEL, FABRICATING METHOD THEREOF, AND DISPLAY DEVICE

RELATED APPLICATIONS

This application is a National Phase of PCT Patent Application No. PCT/CN2019/094128 having International filing date of Jul. 1, 2019, which claims the benefit of priority of Chinese Patent Application No. 201910355339.6 filed on Apr. 29, 2019. The contents of the above applications are all incorporated by reference as if fully set forth herein in their entirety.

FIELD AND BACKGROUND OF THE INVENTION

This application relates to the field of display technologies, and, in particular, to a display panel, a fabricating method thereof, and a display device.

In recent years, organic light emitting diodes (OLEDs) have excellent features such as being self-luminous, do not require a backlight, high contrast, thin thickness, wide viewing angles, fast response speed, can be used for flexible panels, wide temperature range, and simple structure and process, so they are considered to be the next generation of emerging flat panel display application technologies.

At present, anode material of top-emitting OLEDs is usually made of indium tin oxide. However, indium tin oxide is costly and toxic, which greatly limits the practical application of OLEDs. Therefore, there is an urgent need for a lower cost and less toxic anode material to replace indium tin oxide.

SUMMARY OF THE INVENTION

An object of the present application is to provide a display panel, a fabricating method thereof, and a display device to reduce cost of forming an anode and reduce toxicity of the anode.

In order to solve the above problems, an embodiment of this application provides a display panel, the display panel includes: a substrate; a first transparent conductive layer disposed on the substrate, material of the first transparent conductive layer is nitrogen oxide; a first reflective layer disposed on the first transparent conductive layer; and a second transparent conductive layer disposed on the first reflective layer, material of the second transparent conductive layer is nitrogen oxide.

Wherein the materials of the first transparent conductive layer and the second transparent conductive layer are both titanium indium oxynitride.

Wherein the first transparent conductive layer is formed by sputtering an indium oxide target and a titanium nitride target on the substrate.

Wherein a mass ratio of indium oxide to titanium nitride in the first transparent conductive layer is 1.1 to 2.2.

Wherein a thickness of the first transparent conductive layer is less than a thickness of the first reflective layer, and a thickness of the second transparent conductive layer is less than the thickness of the first transparent conductive layer.

Wherein the thickness of the first transparent conductive layer ranges from 30 to 100 nm, the thickness of the first reflective layer ranges from 40 to 200 nm, and the thickness of the second transparent conductive layer ranges from 5 to 20 nm.

Wherein the display panel further includes: a second reflective layer disposed on the second transparent conductive layer; and a third transparent conductive layer disposed on the second reflective layer.

Wherein the display panel further includes a light emitting function layer, a cathode, and a light outcoupling layer disposed on the second transparent conductive layer in sequence, wherein the light emitting function layer includes a hole injection layer, a hole transport layer, a light emitting layer, and an electron transport layer which are disposed sequentially away from the second transparent conductive layer.

In order to solve the above problems, an embodiment of this application provides a method of fabricating a display panel, the method of fabricating a display panel includes the steps of: providing a substrate; forming a first transparent conductive layer on the substrate, wherein material of the first transparent conductive layer is nitrogen oxide; forming a first reflective layer on the first transparent conductive layer; and forming a second transparent conductive layer on the first reflective layer, wherein material of the second transparent conductive layer is nitrogen oxide.

Wherein the materials of the first transparent conductive layer and the second transparent conductive layer are titanium indium oxynitride, titanium aluminum oxynitride, titanium silver oxynitride or zinc titanium oxynitride.

Wherein the step of forming the first transparent conductive layer on the substrate specifically includes: forming the first transparent conductive layer by sputtering an indium oxide target and a titanium nitride target on the substrate.

Wherein after the step of forming the second transparent conductive layer on the first reflective layer, the method further includes: forming a second reflective layer on the second transparent conductive layer; and forming a third transparent conductive layer on the second reflective layer.

In order to solve the above problems, an embodiment of this application provides a display device, the display device includes a driving circuit and a display panel, the driving circuit being configured to provide a driving voltage to the display panel, wherein the display panel includes: a substrate; a first transparent conductive layer disposed on the substrate, wherein material of the first transparent conductive layer is nitrogen oxide; a first reflective layer disposed on the first transparent conductive layer; and a second transparent conductive layer disposed on the first reflective layer, wherein material of the second transparent conductive layer is nitrogen oxide.

Wherein the materials of the first transparent conductive layer and the second transparent conductive layer are both titanium indium oxynitride.

Wherein the first transparent conductive layer is formed by sputtering an indium oxide target and a titanium nitride target on the substrate.

Wherein a mass ratio of indium oxide to titanium nitride in the first transparent conductive layer is 1.1 to 2.2.

Wherein a thickness of the first transparent conductive layer is less than a thickness of the first reflective layer, and a thickness of the second transparent conductive layer is less than the thickness of the first transparent conductive layer.

Wherein the thickness of the first transparent conductive layer ranges from 30 to 100 nm, the thickness of the first reflective layer ranges from 40 to 200 nm, and the thickness of the second transparent conductive layer ranges from 5 to 20 nm.

Wherein the display panel further includes: a second reflective layer disposed on the second transparent conductive layer; and a third transparent conductive layer disposed on the second reflective layer.

Wherein the display panel further includes a light emitting function layer, a cathode, and a light outcoupling layer disposed on the second transparent conductive layer in sequence, wherein the light emitting function layer includes a hole injection layer, a hole transport layer, a light emitting layer, and an electron transport layer which are disposed sequentially away from the second transparent conductive layer.

The beneficial effects of the present application are as follows: different from the prior art, the display panel provided by the present application includes a substrate, a first transparent conductive layer disposed on the substrate, a first reflective layer disposed on the first transparent conductive layer, and a second transparent conductive layer disposed on the first reflective layer, wherein the materials of the first transparent conductive layer and the second transparent conductive layer are both nitrogen oxide. Thus, transparent conductive oxynitride is used instead of indium tin oxide to form the anode, not only the cost of forming the anode is reduced, the toxicity of the anode is reduced, but also luminous efficiency of the display panel is improved.

BRIEF DESCRIPTION OF THE SEVERAL VIEWS OF THE DRAWINGS

In order to more clearly illustrate the technical solutions in the embodiments of the present application, the drawings which are used in the description of the embodiments will be briefly described below. It is obvious that the drawings in the following description are only some embodiments of the present application. Other drawings can also be obtained from those skilled in the art without paying any creative effort.

DESCRIPTION OF SPECIFIC EMBODIMENTS OF THE INVENTION

The present application will be further described in detail below with reference to the accompanying drawings and embodiments. It is specifically noted that the following embodiments are merely illustrative of the present application, but are not intended to limit the scope of the application. In the same manner, the following embodiments are only partial embodiments of the present application, and they are not all of the embodiments, and all other embodiments obtained by those skilled in the art without creative efforts are within the scope of the present application.

At present, material of anode of the top-emitting OLEDs is usually made of indium tin oxide (ITO), but indium tin oxide is expensive and toxic, which greatly limits practical applications of OLEDs. Therefore, there is an urgent need for a lower cost and less toxic anode material to replace indium tin oxide. In order to solve the above technical problem, the technical solution adopted by the present application is to provide a display panel to reduce cost of forming the anode and reduce toxicity of the anode.

Figure 1:
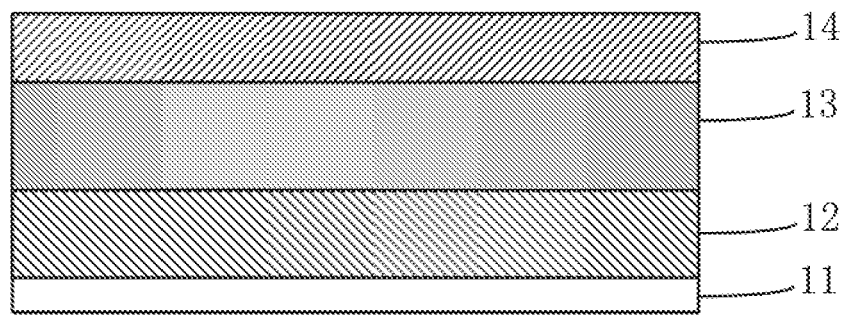
FIG. 1 is a schematic structural diagram of a display panel provided by an embodiment of the present application.

Referring to FIG. 1, FIG. 1 is a schematic structural diagram of a display panel provided by an embodiment of the present application. As shown in FIG. 1, the display panel 10 includes a substrate 11, a first transparent conductive layer 12 disposed on the substrate 11, a first reflective layer 13 disposed on the first transparent conductive layer 12, and a second transparent conductive layer 14 disposed on the first reflective layer 13. In this embodiment, the materials of the first transparent conductive layer 12 and the second transparent conductive layer 14 are both nitrogen oxide.

The substrate 11 may be a TFT substrate with a base. Specifically, the base may be a glass base or a rigid resin base, or may be a flexible base for fabricating a flexible display panel, and material of the flexible base may be one of organic polymers such as polyimide, polycarbonate, polyethylene terephthalate, and polyethersulfone substrate. Material of the first reflective layer 13 may be one or more of metals such as silver, aluminum, gold, copper, and nickel, and may be other materials having high light reflectivity.

Specifically, the materials of the first transparent conductive layer 12 and the second transparent conductive layer 14 are one of nitrogen oxides such as titanium indium oxynitride, titanium aluminum oxynitride, titanium silver oxynitride or zinc titanium oxynitride. In this embodiment, the material of the first transparent conductive layer 12 and the material of the second transparent conductive layer 14 may be the same kind of nitrogen oxide or different nitrogen oxides.

If the materials of the first transparent conductive layer 12 and the second transparent conductive layer 14 are the same kind of nitrogen oxide, the first transparent conductive layer 12 and the second transparent conductive layer 14 may be made of the same material, and formed by the same or different deposition processes. Wherein the above-mentioned deposition process may include at least one of an evaporation process, a sputtering process, a spray pyrolysis process, a chemical vapor deposition process, a dip coating process, a reactive ion evaporation process, a wet coating process, and a screen printing process.

Specifically, the first transparent conductive layer 12 and the second transparent conductive layer 14 may have different electrical properties due to different deposition processes, even if the first transparent conductive layer 12 and the second transparent conductive layer 14 are made of the same material. For example, the first transparent conductive layer 12 may be formed by a sputtering process, and the second transparent conductive layer 14 may be formed of the same material with the first transparent conductive layer 12 by a chemical vapor deposition process. Although the first transparent conductive layer 12 and the second transparent conductive layer 14 are formed of the same kind of nitrogen oxide, they have different electrical properties.

The above-mentioned first transparent conductive layer 12, the first reflective layer 13, and the second transparent conductive layer 14 constitute an anode of the display panel 10, since the materials of the first transparent conductive layer 12 and the second transparent conductive layer 14 are both nitrogen oxides, and the production cost and toxicity of the transparent conductive nitrogen oxides are less than that of indium tin oxide, it can provide an anode which has less toxicity and lower production cost. In addition, the transparent conductive oxynitride has both low resistivity and high transmittance, and can also improve luminous efficiency of the display panel.

In an embodiment, the materials of the first transparent conductive layer 12 and the second transparent conductive layer 14 may be both titanium indium oxynitride. Compared with indium tin oxide, titanium indium oxynitride has lower resistivity, higher light transmittance, and better flexibility, which not only improves the luminous efficiency of the display panel, but also improves bending life of the display panel.

Specifically, the first transparent conductive layer 12 is formed by sputtering an indium oxide target and a titanium nitride target on the substrate, wherein a mass ratio of indium oxide to titanium nitride in the first transparent conductive layer 12 is 1.1 to 2.2, so that a titanium indium oxynitride film layer with good particle uniformity, low resistivity and high light transmittance is obtained.

For example, an indium oxide target and a titanium nitride target may be simultaneously sputtered on the substrate 11 to form the titanium indium oxynitride film layer, and both radio frequency and direct current excitations are simultaneously used on the indium oxide target and the titanium nitride target, thereby combining a higher film formation rate with a higher plasma density, promoting surface diffusion of the deposited atoms, and obtaining a dense, coarse-grained, low-defect, and high-crystalline titanium indium oxynitride crystal structure, so that the luminous efficiency of the display panel is improved more effectively, and the bending life of the display panel is improved.

In some embodiments, the second transparent conductive layer 14 may use the same fabricating method with the first transparent conductive layer 12. For example, the second transparent conductive layer 14 may also be formed by sputtering an indium oxide target and a titanium nitride target on the first reflective layer 13 to further improve luminous efficiency and the bending life of the display panel.

In some embodiments, in consideration of the anode structure of the first transparent conductive layer 12/the first reflective layer 13/the second transparent conductive layer 14 described above, if a thickness of the first reflective layer 13 increases, both the carrier concentration and the resistivity decrease, and the carrier mobility increases accordingly, so a thickness of the first transparent conductive layer 12 could be less than the thickness of the first reflective layer 13, and a thickness of the second transparent conductive layer 14 could be less than the thickness of the first transparent conductive layer 12.

Specifically, the thickness of the first transparent conductive layer 12 may range from 30 to 100 nm, the thickness of the first reflective layer 13 may range from 40 to 200 nm, and the thickness of the second transparent conductive layer 14 may range from 5 to 20 nm. For example, the thickness of the first transparent conductive layer 12 may be 40 nm, the thickness of the first reflective layer 13 may be 110 nm, and the thickness of the second transparent conductive layer 14 may be 15 nm.

Figure 2:
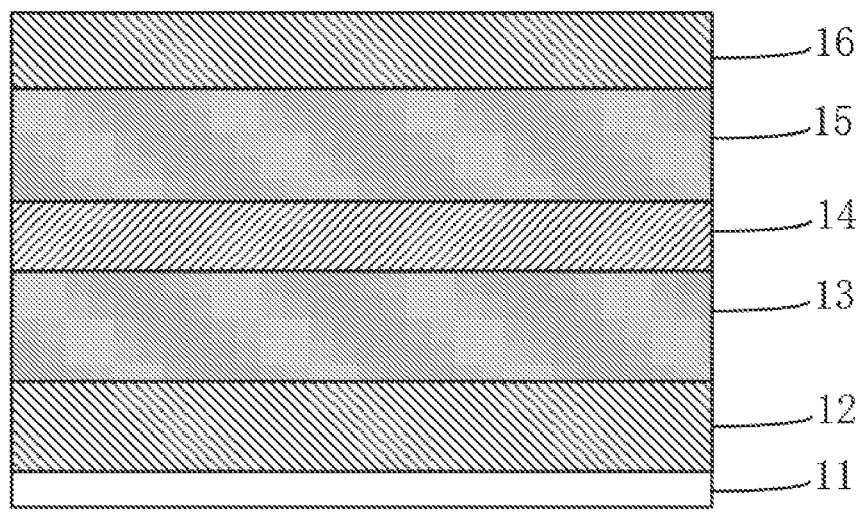
FIG. 2 is another schematic structural diagram of a display panel provided by an embodiment of the present application.

In other embodiments, as shown in FIG. 2, the display panel 10 further includes a second reflective layer 15 disposed on the second transparent conductive layer 14, and a third transparent conductive layer 16 disposed on the second reflective layer 15. In this way, by providing two reflective layers, the light reaching the anode can be more effectively reflected to further improve the luminous efficiency of the display panel.

Material of the second reflective layer 15 may be one or more of metals such as silver, aluminum, gold, copper, and nickel, and may be other materials having high light reflectivity. Material of the third transparent conductive layer 16 may be one of titanium indium oxynitride, titanium aluminum oxynitride, titanium silver oxynitride and zinc titanium oxynitride. Specifically, the material of the second reflective layer 15 may be the same with the material of the first reflective layer 13, and the material of the third transparent conductive layer 16 may be the same with the material of the first or the second transparent conductive layer 12/14.

Figure 3:
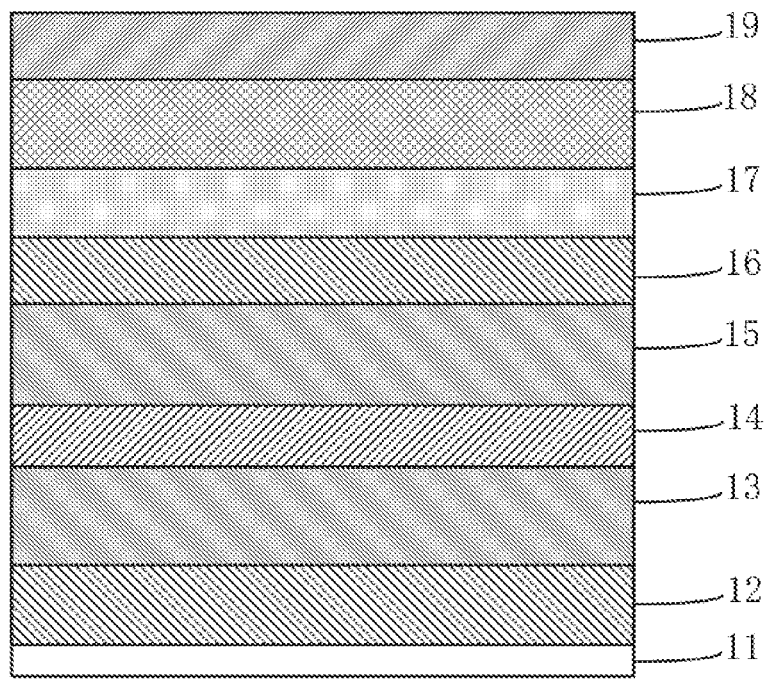
FIG. 3 is another schematic structural diagram of a display panel provided by an embodiment of the present application.

In a specific embodiment, as shown in FIG. 3, the display panel 10 further includes a light emitting function layer 17, a cathode 18, and a light outcoupling layer 19 disposed on the above-mentioned second transparent conductive layer 14 in sequence, wherein the light emitting function layer 17 may include a hole injection layer (not shown), a hole transport layer (not shown), a light emitting layer (not shown), and an electron transport layer (not shown) which are disposed sequentially away from the second transparent conductive layer 12. The light outcoupling layer 19 is used to increase out-coupling efficiency and reduce the plasma on metal surfaces.

Specifically, the display panel 10 may further include a thin film encapsulation layer (not shown), and the thin film encapsulation layer covers the above-mentioned light outcoupling layer 19. Wherein the thin film encapsulation layer may specifically include an inorganic layer and an organic layer which are alternately stacked, and a total number of layers of the inorganic layer and the organic layer is not less than three.

Different from the prior art, the display panel provided by the embodiment of the present application can reduce cost of forming the anode, reduce toxicity of the anode, and improve the luminous efficiency of the display panel by using transparent conductive oxynitride instead of indium tin oxide to obtain the anode.

Figure 4:
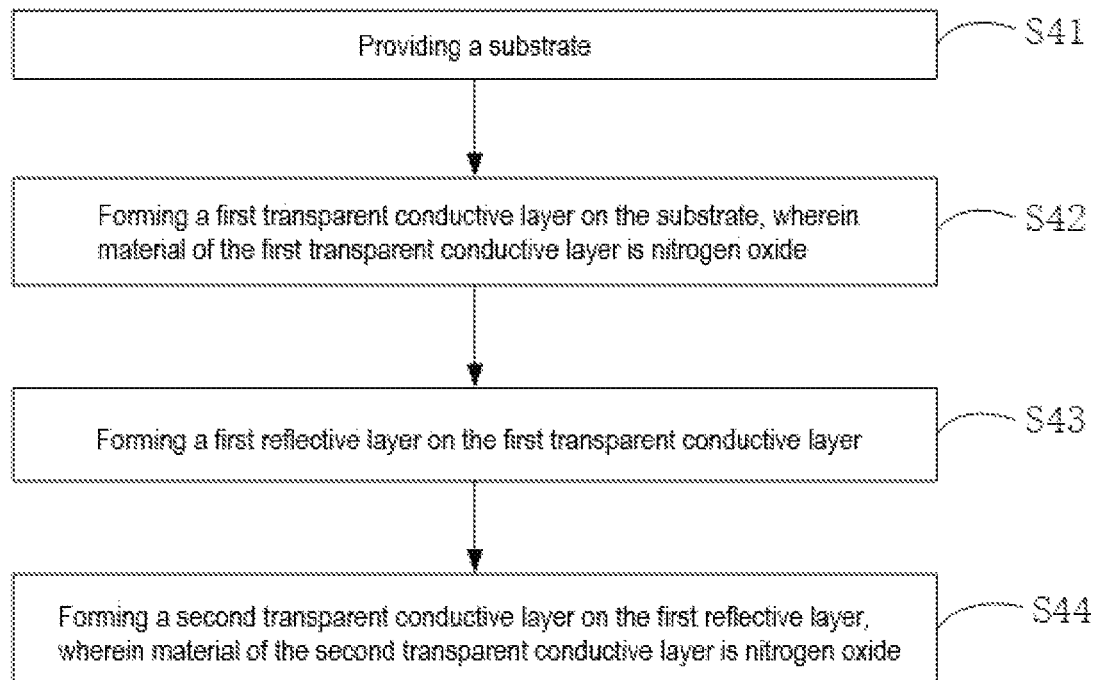
FIG. 4 is a schematic flowchart of a method for fabricating a display panel provided by an embodiment of the present application.

Referring to FIG. 4, FIG. 4 is a schematic flowchart of a method for fabricating a display panel provided by an embodiment of the present application. As shown in FIG. 4, the method for fabricating a display panel includes the steps of:

S41: providing a substrate.

The substrate may be a TFT substrate with a base. Specifically, the base may be a glass base or a rigid resin base, or may be a flexible base for fabricating a flexible display panel, and material of the flexible base may be one of organic polymers such as polyimide, polycarbonate, polyethylene terephthalate, and polyethersulfone substrate.

S42: forming a first transparent conductive layer on the substrate, wherein material of the first transparent conductive layer is nitrogen oxide.

Material of the first transparent conductive layer may be one of titanium indium oxynitride, titanium aluminum oxynitride, titanium silver oxynitride and zinc titanium oxynitride. Compared with indium tin oxide, the transparent conductive nitrogen oxides have lower production cost and less toxicity.

Specifically, the first transparent conductive layer 12 may be formed on the substrate by a deposition process. Wherein the deposition process may include at least one of an evaporation process, a sputtering process, a spray pyrolysis process, a chemical vapor deposition process, a dip coating process, a reactive ion evaporation process, a wet coating process, and a screen printing process.

In an embodiment, the material of the first transparent conductive layer may be titanium indium oxynitride. Compared with indium tin oxide, titanium indium oxynitride has lower resistivity, higher light transmittance, and better flexibility, which not only improves luminous efficiency of the display panel, but also improves bending life of the display panel.

In a specific embodiment, S42 may specifically include:

The first transparent conductive layer is formed by sputtering an indium oxide target and a titanium nitride target on the substrate. For example, the indium oxide target and the titanium nitride target may be simultaneously sputtered on the substrate to form a titanium indium oxynitride film layer, and both radio frequency and direct current excitations are simultaneously used on the indium oxide target and the titanium nitride target, thereby combining a higher film formation rate with a higher plasma density, promoting surface diffusion of the deposited atoms, and obtaining a dense, coarse-grained, low-defect, and high-crystalline titanium indium oxynitride crystal structure, so that the luminous efficiency of the display panel is improved more effectively, and the bending life of the display panel is improved.

In some embodiments, a mass ratio of indium oxide to titanium nitride in the first transparent conductive layer 12 may be controlled to be 1.1 to 2.2, so that a titanium indium oxynitride film layer with good particle uniformity, low resistivity and high light transmittance is obtained.

S43: forming a first reflective layer on the first transparent conductive layer.

For example, the first reflective layer can be deposited on the first transparent conductive layer by sputter deposition, physical vapor deposition, or other deposition process. Material of the first reflective layer may be one or more of metals such as silver, aluminum, gold, copper, and nickel, and may be other materials having high light reflectivity.

S44: forming a second transparent conductive layer on the first reflective layer, wherein material of the second transparent conductive layer is nitrogen oxide.

Material of the second transparent conductive layer is one of titanium indium oxynitride, titanium aluminum oxynitride, titanium silver oxynitride and zinc titanium oxynitride.

In an embodiment, the material of the second transparent conductive layer is titanium indium oxynitride. Specifically, titanium indium oxynitride may be sputtered on the first reflective layer to form a second transparent conductive layer.

In some embodiments, the fabricating method of the second transparent conductive layer may be the same with that of the first transparent conductive layer. For example, S44 may specifically include:

By sputtering an indium oxide target and a titanium nitride target on the first reflective layer, the second transparent conductive layer having larger crystal grains, denser texture, less defects, and higher crystalline quality is formed, thereby further improving the luminous efficiency and the bending life of the display panel.

In some embodiments, in consideration of the anode structure of the above-mentioned first transparent conductive layer, the first reflective layer, and the second transparent conductive layer described above, if a thickness of the first reflective layer increases, both the carrier concentration and the resistivity decrease, and the carrier mobility increases accordingly, so a thickness of the first transparent conductive layer could be less than the thickness of the first reflective layer, and a thickness of the second transparent conductive layer could be less than the thickness of the first transparent conductive layer.

Specifically, the thickness of the first transparent conductive layer may range from 30 to 100 nm, the thickness of the first reflective layer may range from 40 to 200 nm, and the thickness of the second transparent conductive layer may range from 5 to 20 nm. For example, the thickness of the first transparent conductive layer may be 40 nm, the thickness of the first reflective layer may be 110 nm, and the thickness of the second transparent conductive layer may be 15 nm.

Figure 5:
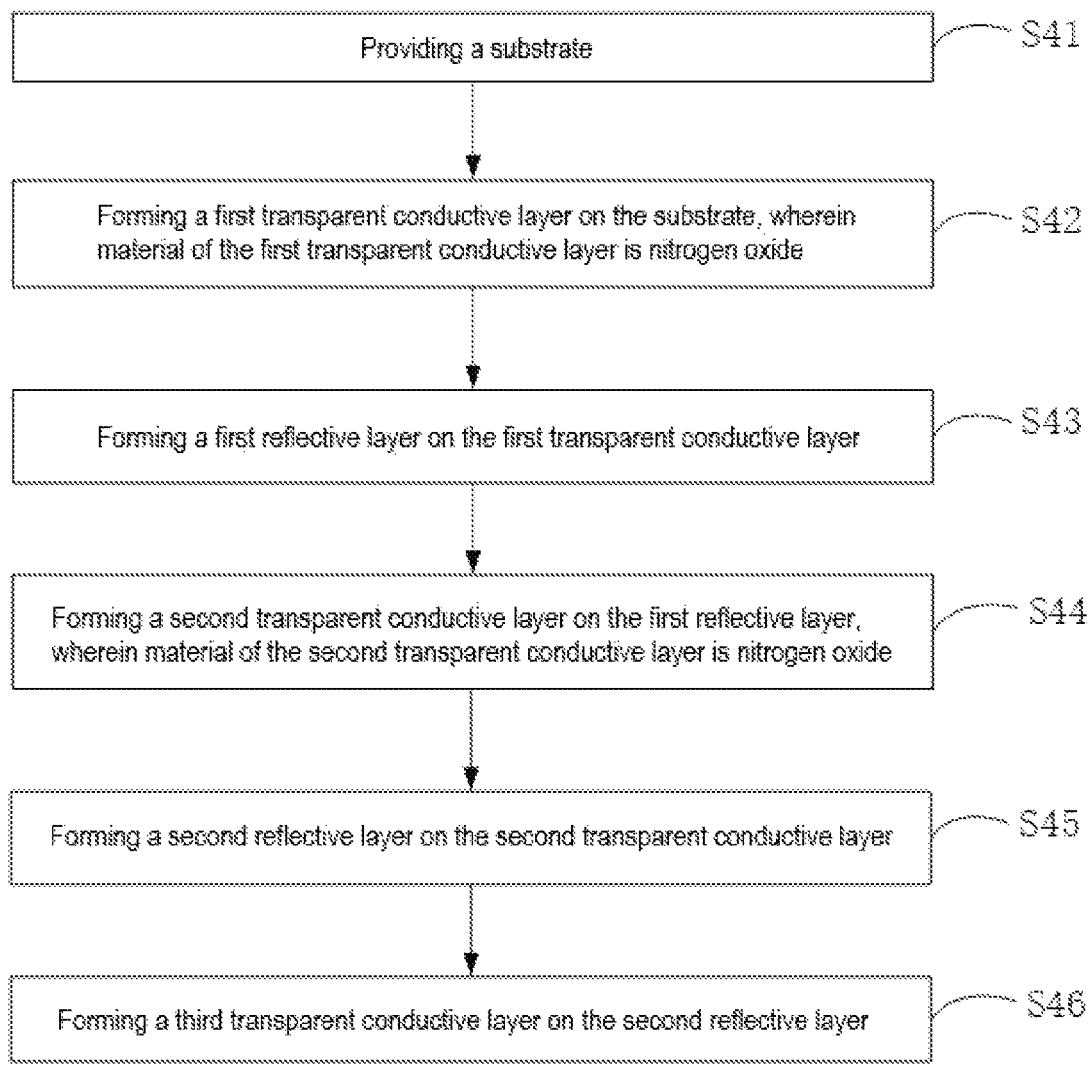
FIG. 5 is another schematic flowchart of a method for fabricating a display panel provided by an embodiment of the present application.

In another embodiment, as shown in FIG. 5, after S44, the method may further include:

S45: forming a second reflective layer on the second transparent conductive layer.

Material of the second reflective layer may be one or more of metals such as silver, aluminum, gold, copper, and nickel, and may be other materials having high light reflectivity. Specifically, the material of the second reflective layer may be the same with the material of the first reflective layer.

S46: forming a third transparent conductive layer on the second reflective layer.

Material of the third transparent conductive layer may be one of titanium indium oxynitride, titanium aluminum oxynitride, titanium silver oxynitride and zinc titanium oxynitride. Specifically, the material of the third transparent conductive layer may be the same with the material of the first or the second transparent conductive layer.

In this way, by providing two reflective layers, it is possible to more effectively reflect the light reaching the anode, thereby further improving the luminous efficiency of the display panel.

In another specific embodiment, after S44, the method may further include:

Step A: forming a light emitting function layer, a cathode, and a light outcoupling layer on the second transparent conductive layer in sequence.

The light emitting function layer may include a hole injection layer, a hole transport layer, a light emitting layer, and an electron transport layer which are disposed sequentially away from the second transparent conductive layer. The light outcoupling layer is used to increase out-coupling efficiency and reduce plasma on metal surfaces.

Step B: forming a thin film encapsulation layer on the light outcoupling layer.

The thin film encapsulation layer may include an inorganic layer and an organic layer which are alternately stacked, and a total number of layers of the inorganic layer and the organic layer is not less than three, thereby effectively preventing water and oxygen from intruding into the interior of the display panel.

Different from the prior art, the fabricating method of the display panel provided by the embodiment of the present application can reduce cost of forming the anode, reduce toxicity of the anode, and improve luminous efficiency of the display panel by using transparent conductive oxynitride instead of indium tin oxide to obtain the anode.

Figure 6:
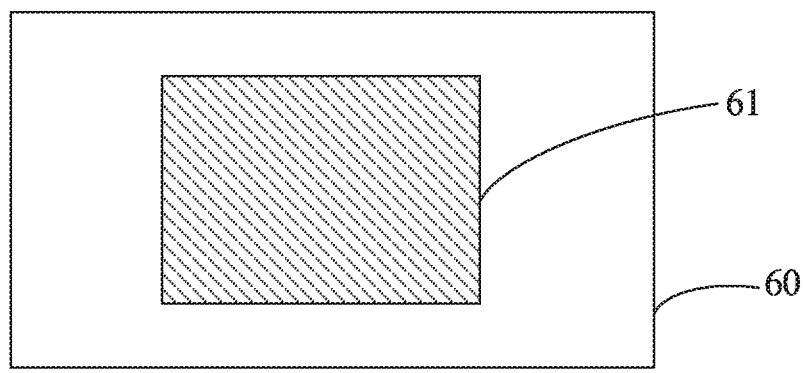
FIG. 6 is a schematic structural diagram of a display device provided by an embodiment of the present application.

Referring to FIG. 6, FIG. 6 is a schematic structural diagram of a display device provided by an embodiment of the present application. As shown in FIG. 6, the display device 60 includes a driving circuit and the display panel 61 according to anyone of the above embodiments, wherein the driving circuit is configured to provide a driving voltage to the display panel 61.

The display panel 61 includes a substrate, a first transparent conductive layer disposed on the substrate, a first reflective layer disposed on the first transparent conductive layer, and a second transparent conductive layer disposed on the first reflective layer, wherein the materials of the first transparent conductive layer and the second transparent conductive layer are both nitrogen oxide.

Different from the prior art, the display device in the embodiment can reduce cost of forming the anode, reduce toxicity of the anode, and improve luminous efficiency of the display panel by using transparent conductive oxynitride instead of indium tin oxide to obtain the anode.

The above is only the preferred embodiments of the present application, and is not intended to limit the present application. Any modifications, equivalent substitutions and improvements made within the spirit and principles of the present application should be within the scope of the present application.

What is claimed is:

1. A display panel, comprising:
   a substrate;
   a first transparent conductive layer disposed on the substrate, wherein material of the first transparent conductive layer is nitrogen oxide;
   a first reflective layer disposed on the first transparent conductive layer; and
   a second transparent conductive layer disposed on the first reflective layer, wherein material of the second transparent conductive layer is nitrogen oxide,
   wherein the materials of the first transparent conductive layer and the second transparent conductive layer are both titanium indium oxynitride, the first transparent conductive layer is formed by sputtering an indium oxide target and a titanium nitride target on the substrate, and a mass ratio of indium oxide to titanium nitride in the first transparent conductive layer is 1.1 to 2.2.

2. The display panel as claimed in claim 1, wherein a thickness of the first transparent conductive layer is less than a thickness of the first reflective layer, and a thickness of the second transparent conductive layer is less than the thickness of the first transparent conductive layer.

3. The display panel as claimed in claim 2, wherein the thickness of the first transparent conductive layer ranges from 30 to 100 nm, the thickness of the first reflective layer ranges from 40 to 200 nm, and the thickness of the second transparent conductive layer ranges from 5 to 20 nm.

4. The display panel as claimed in claim 1, wherein the display panel further comprises:
   a second reflective layer disposed on the second transparent conductive layer; and
   a third transparent conductive layer disposed on the second reflective layer.

5. The display panel as claimed in claim 1, wherein the display panel further comprises a light emitting function layer, a cathode, and a light outcoupling layer disposed on the second transparent conductive layer in sequence, wherein the light emitting function layer comprises a hole injection layer, a hole transport layer, a light emitting layer, and an electron transport layer which are disposed sequentially away from the second transparent conductive layer.

6. A method of fabricating a display panel, comprising the steps of:
   providing a substrate;
   forming a first transparent conductive layer on the substrate, wherein material of the first transparent conductive layer is nitrogen oxide, wherein the step of forming the first transparent conductive layer on the substrate comprises forming the first transparent conductive layer by sputtering an indium oxide target and a titanium nitride target on the substrate;
   forming a first reflective layer on the first transparent conductive layer; and
   forming a second transparent conductive layer on the first reflective layer, wherein material of the second transparent conductive layer is nitrogen oxide.

7. The method as claimed in claim 6, wherein the material of the second transparent conductive layer is titanium indium oxynitride, titanium aluminum oxynitride, titanium silver oxynitride or zinc titanium oxynitride.

8. The method as claimed in claim 6, wherein after the step of forming the second transparent conductive layer on the first reflective layer, the method further comprises:
   forming a second reflective layer on the second transparent conductive layer; and
   forming a third transparent conductive layer on the second reflective layer.

9. A display device, comprising a driving circuit and a display panel, the driving circuit being configured to provide a driving voltage to the display panel, wherein the display panel comprises:
   a substrate;
   a first transparent conductive layer disposed on the substrate, wherein material of the first transparent conductive layer is nitrogen oxide;
   a first reflective layer disposed on the first transparent conductive layer;
   a second transparent conductive layer disposed on the first reflective layer, wherein material of the second transparent conductive layer is nitrogen oxide; and
   a light emitting function layer, a cathode, and a light outcoupling layer disposed on the second transparent conductive layer in sequence,
   wherein the light emitting function layer comprises a hole injection layer, a hole transport layer, a light emitting layer, and an electron transport layer which are disposed sequentially away from the second transparent conductive layer.

10. The display device as claimed in claim 9, wherein the materials of the first transparent conductive layer and the second transparent conductive layer are both titanium indium oxynitride.

11. The display device as claimed in claim 10, wherein the first transparent conductive layer is formed by sputtering an indium oxide target and a titanium nitride target on the substrate.

12. The display device as claimed in claim 11, wherein a mass ratio of indium oxide to titanium nitride in the first transparent conductive layer is 1.1 to 2.2.

13. The display device as claimed in claim 9, wherein a thickness of the first transparent conductive layer is less than a thickness of the first reflective layer, and a thickness of the second transparent conductive layer is less than the thickness of the first transparent conductive layer.

* * * * *